United States Patent
Randazzo et al.

(10) Patent No.: US 8,397,373 B2
(45) Date of Patent: Mar. 19, 2013

(54) METHOD FOR MANUFACTURING A MULTILAYER POLYMERIC ACTUATOR

(75) Inventors: Marco Randazzo, Genoa (IT); Renato Buzio, Campomorone (IT); Giulio Sandini, Genoa (IT); Ugo Valbusa, Genoa (IT)

(73) Assignees: Fondazione Istituto Italiano di Tecnologia, Genoa (IT); Universita Degli Studi di Genova, Genoa (IT)

( * ) Notice: Subject to any disclaimer, the term of this patent is extended or adjusted under 35 U.S.C. 154(b) by 193 days.

(21) Appl. No.: 12/921,393

(22) PCT Filed: Mar. 6, 2009

(86) PCT No.: PCT/IB2009/050937
§ 371 (c)(1),
(2), (4) Date: Sep. 7, 2010

(87) PCT Pub. No.: WO2009/112988
PCT Pub. Date: Sep. 17, 2009

(65) Prior Publication Data
US 2011/0016705 A1 Jan. 27, 2011

(30) Foreign Application Priority Data
Mar. 10, 2008 (IT) .............................. TO2008A0180

(51) Int. Cl.
*H01F 7/06* (2006.01)
(52) U.S. Cl. ............ 29/605; 29/592.1; 29/606; 29/841; 29/855; 310/311; 310/328; 310/366; 310/369
(58) Field of Classification Search ................. 29/592.1, 29/595, 602.1, 841, 855, 858, 883; 310/311, 310/328, 366, 369
See application file for complete search history.

(56) References Cited

U.S. PATENT DOCUMENTS

| | | | |
|---|---|---|---|
| 4,500,377 A | | 2/1985 | Broussoux et al. |
| 5,494,090 A | * | 2/1996 | Kejha ............................ 152/310 |
| 5,703,425 A | | 12/1997 | Feral et al. |
| 6,891,317 B2 | * | 5/2005 | Pei et al. ........................ 310/328 |
| 7,064,472 B2 | * | 6/2006 | Pelrine et al. ................. 310/324 |
| 7,242,134 B2 | * | 7/2007 | Wallace et al. ............... 310/363 |
| 2003/0006669 A1 | * | 1/2003 | Pei et al. ....................... 310/309 |

(Continued)

FOREIGN PATENT DOCUMENTS

GB 684529 12/1952
WO 2005/086249 9/2005

OTHER PUBLICATIONS

Yuan, W., et al., New electrode materials for dielectric elastomer actuators, Proc. of SPIE 2007, 6524: 65240N-1-65240N-12.

(Continued)

*Primary Examiner* — Paul D Kim
(74) *Attorney, Agent, or Firm* — Steinfl & Bruno LLP

(57) ABSTRACT

A method for manufacturing a multilayer polymeric actuator includes the following steps: arranging a rotating winding core; winding a dielectric film of polymeric material around the winding core; during winding, applying a conductive material on the dielectric film exposed face, in which the application occurs intermittently according to a pre-established sequence, and according to a first and a second geometrical application pattern mutually alternated at each winding turn, so as to form a roll; radially cutting the roll at the ends of a circumferentially localized zone; and connecting a conductive material layers having the first geometrical application pattern one to the other and the conductive material layers having the second geometrical application pattern one to the other.

4 Claims, 5 Drawing Sheets

U.S. PATENT DOCUMENTS

2009/0184606 A1* 7/2009 Rosenthal et al. ............ 310/367

OTHER PUBLICATIONS

Chuc, N., et al., Linear artificial muscle actuator based on synthetic elastomer, Proc. of SPIE 2007, 6524: 65240J-1-65240J-8.

Cohen, Y., Electroactive polymers as artificial muscles—Capabilities, potentials and challenges, Handbook on Biomimetics, Sec. 11, Chapter 8, 2000, 1-13.

Cohen, Y., Artificial muscles based on electroactive polymers as an enabling tool in biomimetics, J. Mechanical Engineering Science 2007, 221: 1149-1156.

Pelrine, R., et al., Electrostriction of polymer dielectrics with compliant electrodes as a means of actuation, Sensors and Actuators 1998, 64: 77-85.

Pelrine, R., et al., High-Speed Electrically Actuated Elastomers with Strain Greater Than 100%, Science 2000, 287: 836-839.

Jung, K., et al., Development of enhanced synthetic elastomer for energy efficient polymer actuators, EAPAD 2006, 6168: 1-14.

Ha, S., et al., Interpenetrating Networks of Elastomers Exhibiting 300% Electrically-Induced Area Strain, EAPAD 2007, 6524: 1-14.

Carpi, F., et al., Helical dielectric elastomer actuators, Smart Materials and Structures 2005, 14: 1-7.

Carpi, F., et al., Folded dielectric elastomer actuators, Smart Materials and Structures 2007, 16: 1-6.

Kofod, G., et al., Actuation response of polyacrylate dielectric elastomers, EAPAD 2001, 4329: 1-7.

Plante, JS, et al., Dielectric Elastomer Actuators for Binary Robotics and Mechatronics, Ph.D. thesis, Dept. Mech. Eng., Massachusetts Institute of Technology, Cambridge, BUT, 2006, 1-153.

Plante, JS, et al., A road to practical dielectric elastomer actuators based robotics and mechatronics: Discrete actuation, EAPAD 2007, 6524: 652406-1-652406-15.

Pei, Q., et al., Multifunctional electroelastomer roll actuators and their application for biomimetic walking robots, EAPAD 2003, 5051: 1-10.

Pei, Q., et al., Multiple-degrees-of-freedom electroelastomer roll actuators, Smart Materials and Structures 2004, 13: N86-N92.

PCT International Search Report for PCT/IB2009/050937 filed on Mar. 6, 2009 in the name of Marco Randazzo, et al.

PCT Written Opinion for PCT/IB2009/050937 filed on Mar. 6, 2009 in the name of Marco Randazzo, et al.

Schlaak, H., et al., Novel Multilayer Electrostatic Solid-state Actuators with Elastic Dielectric, Smart Structures and Materials 2005: Electroactive Polymer Actuators and Devices (EAPAD), Proceedings of the SPIE 2005, 5759: 121-133.

Randazzo, M., et al., Architecture for the Semi-automatic Fabrication and Assembly of Thin-film Based Dielectric Elastomer Actuators, Electroactive Polymer Actuators and Devices (EAPAD) 2008, Proceedings of the SPIE 2008, 6927: 69272D-1-69272D-10.

* cited by examiner

METHOD FOR MANUFACTURING A MULTILAYER POLYMERIC ACTUATOR

CROSS REFERENCE TO RELATED APPLICATIONS

The present application is the US national stage of International Application PCT/IB2009/050937 filed on Mar. 6, 2009 which, in turn, claims priority to Italian Application TO2008A000180, filed on Mar. 10, 2008.

The present invention generally relates to the multilayer polymeric actuators, of the type used for the implementation of artificial muscles.

As it is known, electroactive polymers (EAPs) are polymers capable of responding to electrical stimuli, by changing their shape when an external voltage is applied thereto [1][2]. For this reason, EAPs are often defined also as "artificial muscles", since even if they do not share the same operating principle of the biological muscles, the functional response thereof is similar, and have stress and deformation characteristics which approximate the abilities of mammal muscles. These peculiar characteristics of the EAPs make them extremely interesting in the study of new actuation mechanisms, and it is expected that the continuous improvement thereof, as regards performance and reliability, opens new perspectives on fields such as prosthesis technology, robotics, tele-presence, rehabilitation, etc.

The dielectric elastomer actuators (DEA) [3][4] represent a class of electroactive polymers which have already shown good performance and offer great potentials for mechatronics and robotics applications, particularly in the field of biomimetic mechanisms and humanoid robotics. In fact, DEAs are superior in terms of light weight and energy efficiency compared to the traditional electromagnetic actuators, and have an intrinsic softness which makes the use thereof advantageous when a safe and flexible interaction with the surrounding environment is required. Compared to many other EAPs, the dielectric elastomer actuators are further capable of producing high deformations and forces, and respond to externally applied electrical stimuli with rapid operative cycles.

In its basic configuration, a dielectric elastomer actuator is a "rubber capacitor", consisting in an elastomeric film (the dielectric) with the two faces coated with flexible electrodes. When a high potential difference is applied across the two electrodes, positive charges are formed on one electrode, and negative charges are formed on the other one, thereby generating an attractive electrostatic pressure which is known as Maxwell's stress (see FIG. 1b). Such a stress is equal to the permittivity of the elastomeric dielectric multiplied by the square of the electric field which is applied. All the dielectric materials show the Maxwell's stress effect, but if an elastomer with a low Young module and high breakdown resistance is used as the dielectric means, the electrostatic pressure urges the electrodes to get closer one to the other, thereby compressing the dielectric elastomeric layer. Since the dielectric means is an elastic, yet incompressible material, the elastomer decreases its thickness, but expands its area on the plane perpendicular to the Maxwell's electrostatic pressure (see FIG. 1a).

Such a basic configuration, consisting in a monolayer of elastomeric dielectric, is typically used in laboratory testing to assess the performance of the materials used as a dielectric and as flexible electrodes [5][6][7]. However, the practical applications of mechatronics, requiring high amounts of deformation and force generated, require different and more complex configurations compared to the one described above. In order to produce an effective mechanical work, a dielectric elastomer actuator can be exploited in two different ways: as a contractile unit, if the attractive force between the electrodes is directly used to produce work, or as an expansive unit, if the area expansion of the electrode is exploited. All the possible configurations in which an elastomeric dielectric is used as an actuator employ one of these two operating principles.

A typical contractile actuator can be schematised as a stack of many identical layers electrically connected in parallel, as illustrated in FIG. 2a. In this Figure, as in the following Figures, the dielectric layers are indicated with 10, while the two electrodes arranged on the opposite faces of the dielectric layers are indicated with 11 and 12. When a voltage is applied, the stack is compressed by the electrostatic attraction generated by each layer, causing on the whole a contraction. For a multilayer stack, the contractile deformation displacement depends on the stack height, while the generated force is proportional to the active axial section coated with the flexible electrodes.

The implementation of such operating principle has been carried out in the practice in many different ways, with different manufacturing methods, and actuators with different characteristics. Some examples capable of obtaining a linear contractile movement are composed of helical structures [8], folded geometries [9], and multilayer actuators obtained by centrifugal deposition [10] or assembled [11].

An elastomeric dielectric can also be used as an expansive device, if the area expansion of the electrode is used to produce mechanical work (see FIG. 2b). In this case, the displacement generated by the actuator depends on the area size of the flexible electrodes, while the generated force depends on the actuator thickness (sectional area). Thus, while for the contractile configuration, a multilayer stack is required in order to obtain a higher displacement along the main axis, for the expansive configuration, many layers of elastomeric dielectric need to be stacked in order to obtain a greater sectional area and a greater actuation force. It shall be noted that, due to the elastomeric material softness, the expansion movement produced by such configuration cannot be directly used to push a load. For this reason, the expansive actuators are generally used together with some kind of mechanism (typically, a spring or an external load) which keeps them in a stretched condition, and they operate in an opposite way compared to the contractile actuators. In the absence of a voltage, the actuator remains in the contracted position. Instead, if an external voltage is applied, the elastomer expands until it finds a new balance position with the external spring, thereby allowing the movement of the load. The preload mechanism adopted for expansive DEAs is useful also because the alignment of the polymeric chains involves an increase of the breakdown resistance, allowing the application of a higher electric field [4][12]. As for the contractile configuration, also such a configuration can be implemented in different ways and with different geometries, such as diamond actuators [13], cone actuators [14], spring-coil actuators [15][16], and many others.

There are also actuators in which the dielectric comprises, instead of the elastomer, a polymeric foam. In this case, the dielectric layer is a polymeric foam (silicone, polyurethane, or other) which is insulated on one or both faces by a thin dielectric film with high breakdown resistance (for example, PTFE, Kapton®, Mylar®, VHB adhesive tape). Then the electrode is deposited on the dielectric film surface. The sectional structure of an actuator layer is shown in FIG. 3a, and it is compared to that of a dielectric elastomer actuator (FIG. 3b). The foam layer is indicated with 10a, while the high resistance dielectric film layers are indicated with 10b.

The presence of the high breakdown resistance dielectric films is necessary to prevent a breakdown discharge through the foam, which has a low resistance. When a voltage is applied across the two electrodes of the foam actuator, the foam is compressed by electrostatic attraction (Maxwell's pressure) generated between the two electrodes, similarly to what occurs in a dielectric elastomer actuator. The main difference is that, while the incompressible elastomer is constrained to keep its volume constant (therefore the thickness reduction of the material involves an equal expansion of the area), for a polymeric foam the actuation occurs with a volume change (the thickness reduction does not involve, or involves only in a lesser extent, an area expansion of the actuator). The reduced area expansion of the foam allows using electrodes made of rigid materials (or anyway with reduced elasticity), such as metal films, or conductive rigid polymers (polythiophene, polypyrrole, polyaniline, poly-para-phenylene, etc.). The foam actuators are used as contractile actuators.

A problem related to the actuation principle of the macroscopic polymeric actuators is the high voltage required, typically of the order of kVs, which needs that a particular attention is paid in the insulation of the entire actuator relative to the surrounding environment. Such actuation voltage can be drastically reduced if a thin dielectric polymer film is used. For example, it is considered an electric field of 15V/µm, a typical actuation value for non-preloaded actuators. Such an electric field involves an applied voltage of 9000V for a dielectric layer 0.6 mm thick, and 750V for a dielectric film 50 µm thick. Such a simple calculation shows that it is undoubtedly preferable to have an actuator made of thin dielectric layers.

Unfortunately, the manufacturing of a macroscopic stack actuator, starting from thin dielectric polymer films, can pose several technical issues. The first issue is represented by the film handling and assembling. Differently from the many resistant polymers which are normally used as thin films in the electronic and textile industry (such as Kevlar, polyamides, etc.), the polymers typically used for manufacturing DEAs and foam actuators are quite brittle, and may be easily broken during handling, particularly films with a thickness lower than 100 µm. This makes difficult the development of a manufacturing process in which complex mechanical handling operations of the thin film are performed, as in the case of the folded actuators. Other techniques, such as the layer-by-layer controlled deposition by means of centrifugation of crosslinkable pre-polymers, can pose different issues. First, the presence of a small manufacturing defect in a layer may cause cumulative errors, which may compromise the deposition of all the successive layers, leading to the defectiveness of the entire actuator. Further, the centrifugation processes are efficient only for a limited number of manufactured layers, since as the stack increases in size, the uniformity of the manufactured layer becomes difficult to be controlled. Particularly, the manufacturing of even stacks of some cm length starting from deposited layers having a few microns can be extremely difficult, and requires extremely precise machineries. Finally, the discontinuous nature of an actuator composed of hundreds of deposited dielectric layers may complicate the implementation of contacts between the electrodes.

All the considerations set forth above apply both for multilayer stacks used to produce a contractile movement (stacking is used to increase the actuator displacement) and for those used for an expansive movement (stacking is used to increase the actuator force).

Therefore, the object of the present invention is to provide a method for manufacturing multilayer polymeric actuators which avoids a complex mechanical handling of the film, therefore potentially adverse stresses in the latter.

Therefore, the subject of the invention is a method for manufacturing a multilayer polymeric actuator, comprising the following steps:
   arranging a winding core rotating around a central axis thereof,
   winding a polymeric material dielectric film around the winding core,
   during winding, applying a conductive material on the exposed side of the dielectric film, where said application occurs intermittently according to a pre-established sequence, and according to a first and a second geometrical application patterns mutually alternated at each winding turn, so as to form a roll comprising at least one circumferentially localized zone formed by layers of the dielectric film radially alternated to layers of the conductive material,
   radially cutting the roll at the ends of said circumferentially localized zone, so as to be able to take out a corresponding stack formed by the layers of the dielectric film alternated to the layers of the conductive material, and
   connecting in an electrically conductive manner the conductive material layers having the first geometrical application pattern one to the other and, separately from these, the conductive material layers having the second geometrical application pattern one to the other.

According to the method of the invention, the conductive material layers are deposited during the layering of the device. In order to save manufacturing time and raw material, it is possible to program the concomitant manufacturing of more multilayer stacks, establishing the manufacturing of each actuator in a different angular position of the roll. Further, the stacks can be further assembled one to the other so as to obtain actuators with different dimensions and geometries. In this manner, the handling and assembling of such macroscopic stacks will be simpler. Such a modular assembling also allows a functionality control on each module before the final assembling. If a module results to be defective, it can be simply discarded, instead of compromising the functionality of the entire assembled actuator.

Preferred embodiments of the invention are defined in the dependant claims.

It is a further subject of the invention an apparatus for manufacturing a multilayer polymeric actuator, comprising
   a winding core, capable of rotating around a central axis thereof, which is arranged for winding a polymeric material dielectric film;
   a motorized unit to actuate rotation of said winding core, said motorized unit being further provided with angular measuring means to keep track of the winding core angular position;
   a spraying unit for the application of a conductive material on the dielectric film exposed face during the winding of the latter on the winding core;
   a masking unit, interposed between the spraying unit and the winding core, said masking unit comprising a first and a second masks which are interchangeable in an automated manner; and
   a control unit, programmable to coordinate the winding core motorized unit, the spraying unit and the masking unit so that said application occurs intermittently according to a pre-established sequence, and through said first and second masks mutually alternated at each winding turn of the dielectric film.

Further characteristics and the advantages will be more clearly understood from the following description, with particular reference to the annexed drawings, given by way of nonlimiting example only, in which.

Figure 1:
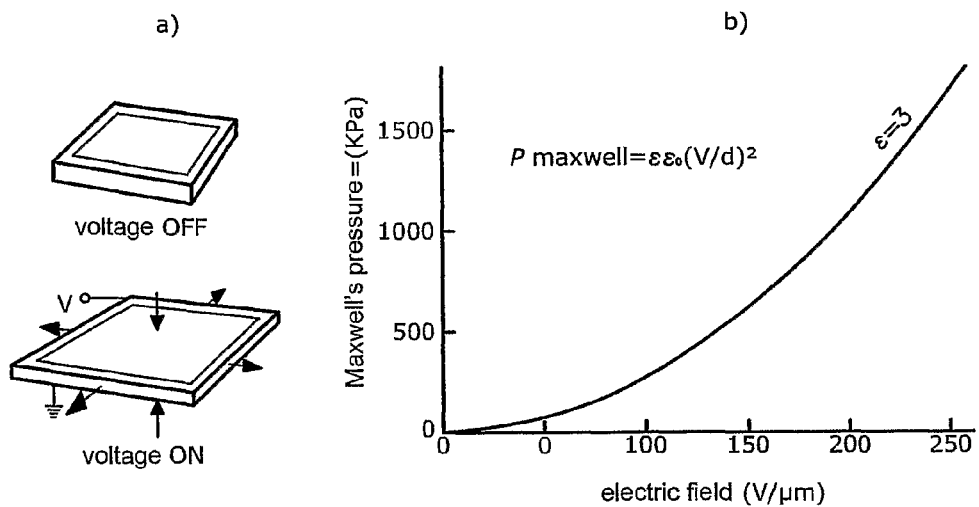
FIGS. 1a and 1b are a schematic view and a graph, respectively, illustrating the actuation principle of a dielectric elastomer monolayer actuator.
Figure 2:
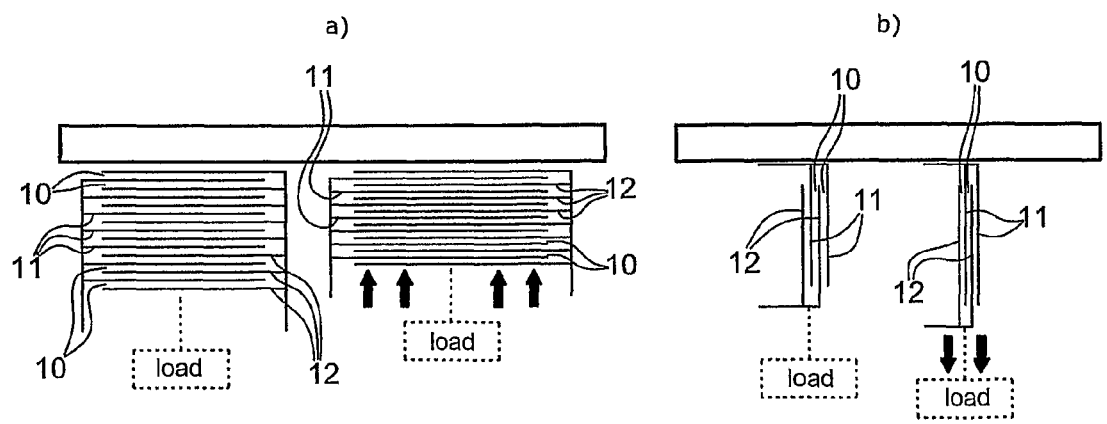
FIGS. 2a and 2b are schematic views illustrating the actuation principle of a multilayer DEA, for a contractile movement and an expansive movement, respectively.
Figure 3:
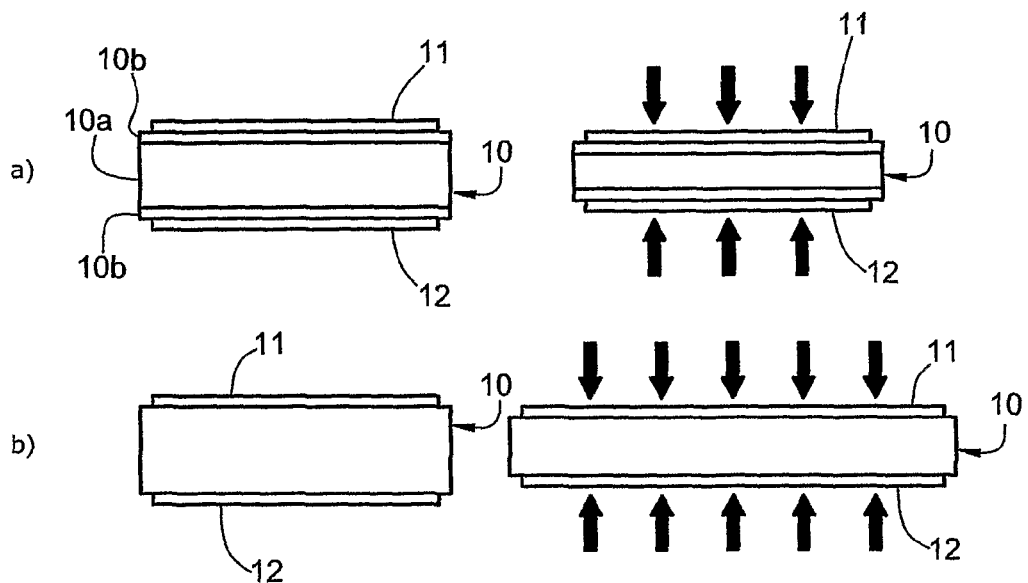
FIGS. 3a and 3b are schematic views illustrating the actuation principle of a monolayer actuator, for a foam actuator and an elastomeric dielectric actuator, respectively.
Figure 4:
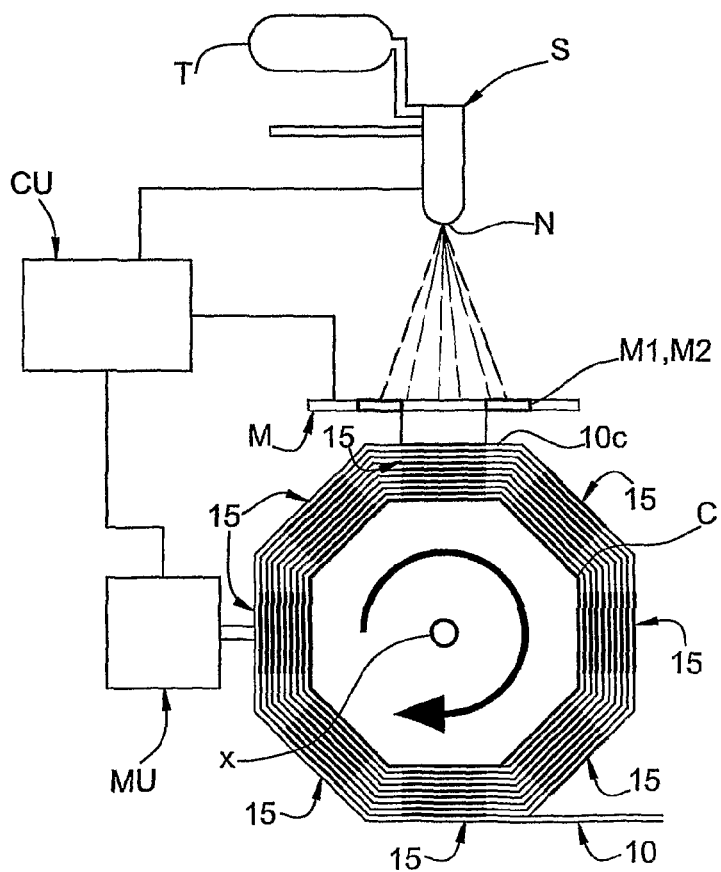
FIG. 4 is an overall schematic view.
Figure 5:
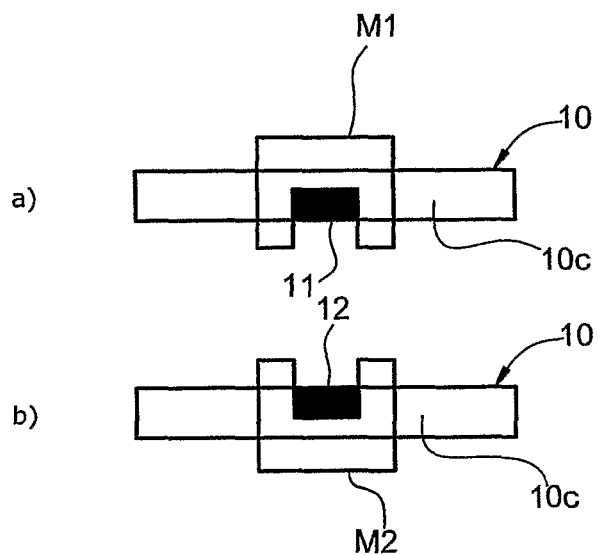
FIGS. 5 and 6 are detailed schematic views, of an apparatus for implementing the method according to the invention.
Figure 6:
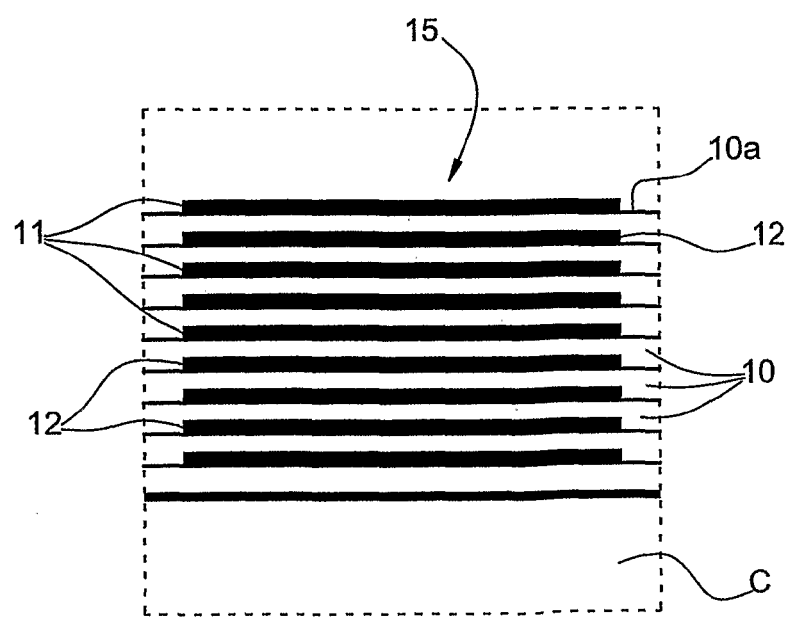

With reference to the FIGS. 4 to 6, a method for manufacturing a multilayer polymeric actuator according to the invention is now described.

Particularly, in FIG. 4 an apparatus for the implementation of such a method is schematically illustrated. Such apparatus comprises a winding core C, which is capable of rotating around a central axis x thereof, as indicated in FIG. 4.

The winding core C is actuated under rotation by a motorized unit MU, which is further provided with angular measuring means (not shown), such as an optical encoder, to keep track of the angular position of the winding core C.

The apparatus further comprises a spraying unit S, provided with a nozzle N oriented towards the winding core C, and a tank T loaded with a conductive material, particularly a conductive elastomeric pre-polymer.

The apparatus additionally comprises a masking unit M, interposed between the spraying unit S and the winding core C. Such a masking unit M comprises two masks M1 and M2 which are interchangeable, illustrated according to a plan view in FIG. 5. Such a masking unit M is manufactured so as to allow the automated exchange of the masks M1 and M2. For example, the masking unit M can be manufactured as a rotating disk, along angular positions of which the two masks M1 and M2 are arranged. Finally, such apparatus is completed by a control unit CU, programmable to coordinate the operations and movements of the motorized unit of the winding core C, of the spraying unit, and of the masking unit M.

The method according to the invention provides for the winding of a polymeric material dielectric film 10 around the winding core C. In the case a DEA is meant to be manufactured, such a film 10 is composed of an elastomeric dielectric, while in the case a foam actuator is meant to be manufactured, such a film 10 is a multilayer film comprising an inner foam layer which is coated, on the two faces thereof, with a dielectric film having a high breakdown resistance (such as, for example, PTFE, Kapton®, Mylar®, VHB adhesive tape).

It shall be apparent that, since the elastomeric tape has to be wound while avoiding deformations due to stretching, the tension thereof has to be controlled. This can occur through a suitable clutch mechanism acting on the unwinding roll (that is, where the original coil is secured). This strategy is common in apparatuses such as videorecorders, labelling machines, paper industry, etc. Alternatively, the elastomeric tape which is used can be originally provided with a rigid protective film (liner) which protects it from stretching, which is removed by means of a mechanism (including, for example, a motorized pulley which wraps the waste liner, and an idle wheel) performing the release of the liner from the elastomer, after the latter adhered to the layer already wound on the winding core.

The winding of the film 10 occurs intermittently according to a pre-established sequence of rotations and stops of the motorized unit of the winding core C.

During the winding, the core C is therefore stopped in pre-established angular positions, and the control unit controls the spraying unit S actuation at such angular positions. Therefore, the spraying unit S provides for the application of the conductive elastomeric prepolymer on the exposed face 10c of the dielectric film 10. Therefore, the application of the conductive elastomer occurs intermittently according to a pre-established sequence, coordinated with the sequence of the movements of the winding core C.

Furthermore, the control unit CU is programmed to control the exchange between the first and the second masks M1 and M2 of the masking unit M at each winding turn of the polymeric film 10. In this manner, a first and a second geometrical application patterns 11, 12 are produced on the dielectric film 10, which are mutually alternated at each winding turn of such film 10. This can be clearly seen in FIGS. 5a and 5b, in which the film 10 is illustrated, according to a plan view, while passing under the mask M1 and under the mask M2 during alternated winding turns.

Therefore, the conductive elastomer deposited according to the first and the second geometrical application patterns 11, 12 forms the positive and negative electrodes associated with each wound layer of the dielectric film 10. Thanks to the masks M1 and M2, the electrodes 11 result to be arranged on the side of the dielectric 10 transversally opposite relative to the electrodes 12. After the deposition of such electrodes, the motorized unit MU controls the rotation of the core C to the successive position, and the process is repeated until obtaining a roll having the desired radius.

Therefore, by means of such a procedure a roll is obtained, comprising at least one circumferentially localized zone, indicated 15 in FIGS. 4 and 6, which is formed by layers of the dielectric film 10 radially alternated to conductive elastomer layers 11, 12 (deposited according to different patterns). By coordinating the winding and deposition operations, it is possible to concomitantly manufacture a plurality of such localized zones, so as to obtain in the end a corresponding number of devices.

After having reached the desired number of layers, the thus obtained roll is subjected to a polymerization step of the elastomeric material, under environmental conditions or, optionally, under controlled temperature and pressure conditions, which also allows the mechanical joining of the layers.

Once the polymerization time has elapsed, the roll is radially cut at the ends of the circumferentially localized zone 15, so as to allow to take out the latter, thus obtaining a multilayer stack 15' as illustrated in FIG. 7a.

Such a stack 15' is then trimmed to remove possible small amounts of lateral dielectric material to ensure that the electrodes are correctly exposed, as illustrated in FIG. 7b.

Finally, as illustrated in FIG. 7c, the conductive elastomer layers having the first geometrical application pattern 11 are connected in an electrically conductive manner one to the other and, separately from these, the conductive elastomer layers having the second geometrical application pattern 12 one to the other. This is obtained by spraying two opposite side faces 13, 14 of the stack 15' with the same conductive elastomer used for the manufacturing of the electrodes, so as to allow the connection of all the electrodes to the positive and negative supply cables.

Figure 7:
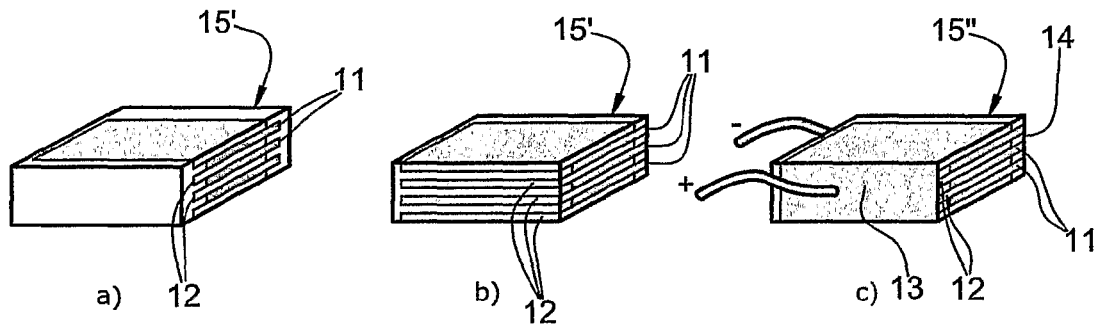
FIGS. 7a to 7c are schematic views illustrating some steps of a method according to the invention.

Finally, the actuator, generally indicated 15" in FIG. 7, is conventionally provided with case and externally insulated.

The above-described procedure can be used to manufacture polymeric actuators having different geometries, both contractile and expansive. According to the shape and dimensions of the masks, it is in fact possible to deposit different patterns of electrodes on the dielectric film, thus generating final actuators with different movement behaviours. Although the inventors have checked that the application of the electrodes is particularly efficient and simple if a spraying technique is used, however they believe that it can also be conducted according to different ways, such as, for example, metal evaporation (however, with the associate concern of creating a suitable vacuum chamber allowing the deposition) or printing by means of rotating rolls (in this case, the use of the mask would be omitted).

Figure 8:
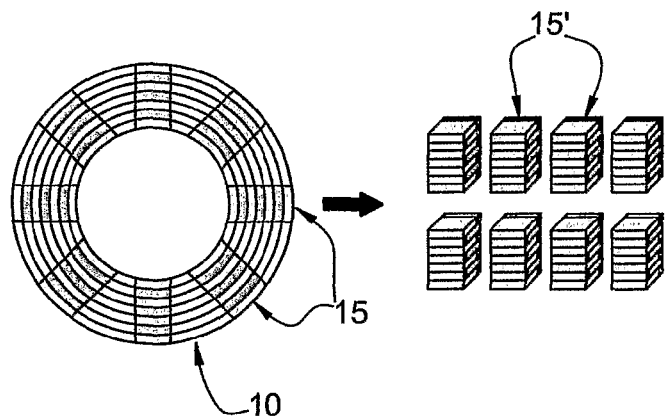
FIG. 8 illustrates the manufacturing of eight contractile actuators starting from a polymeric material roll.
Figure 9:
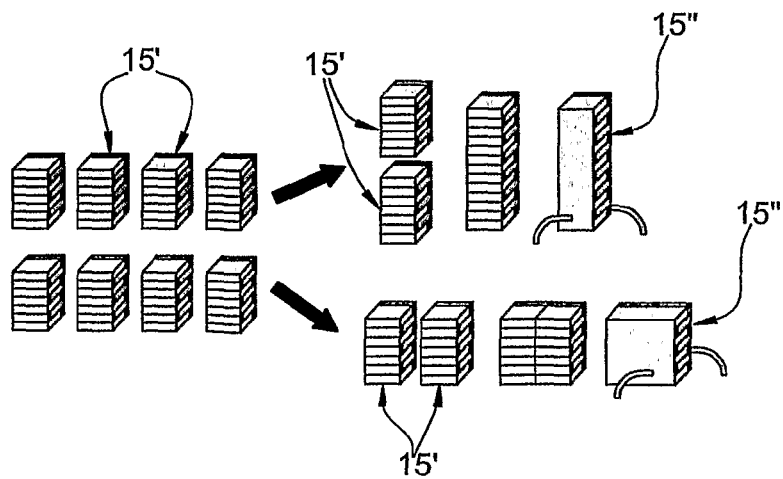
FIG. 9 illustrates the assembling of multilayer stacks to form polymeric actuators having different geometries.

As stated above, in order to save manufacturing time and raw material, it is possible to program the concomitant manufacturing of more multilayer stacks 15' on the apparatus, by establishing the manufacturing of more multilayer localized zones 15 in respective different angular positions of the roll, as illustrated in FIG. 8. Such stacks can be further assembled one to the other to obtain actuators 15" with different dimensions and geometries, as illustrated in FIG. 9. In this manner, the handling and assembling of such macroscopic stacks will result to be very simple. Such a modular assembling further allows a functionality check on each module before the final assembling. If a module results to be defective, it will be simply discarded, instead of compromising the functionality of the entire actuator.

Figure 10:
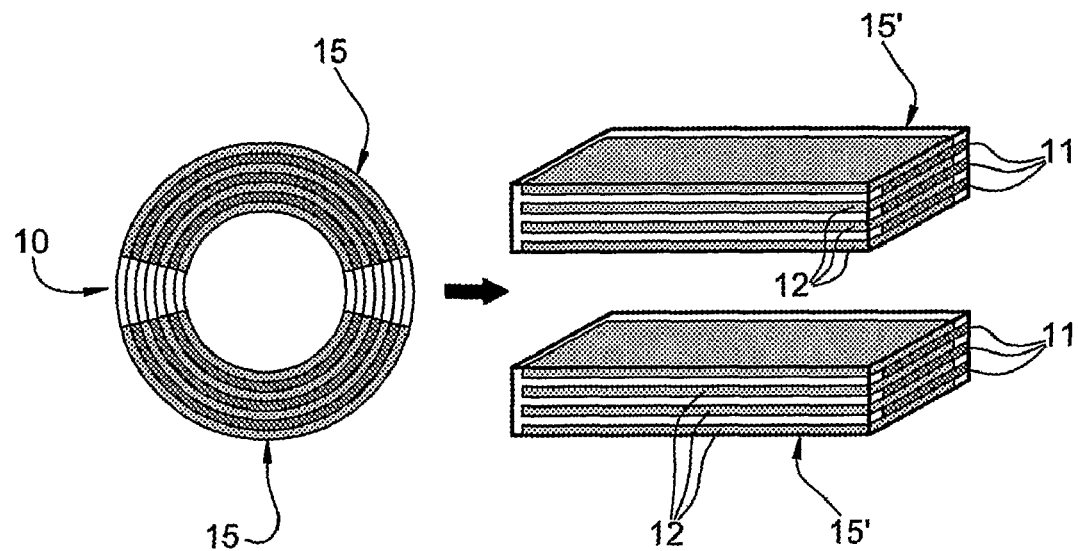
FIG. 10 illustrates the manufacturing of two expansive actuators starting from a polymeric material roll.

An expansive actuator can be obtained by simply changing the deposition pattern of the flexible electrodes on the dielectric film. In order to manufacture large conductive areas, the flexible electrodes can be deposited during a rotation movement of the winding core C with a pre-established extent. In this manner, a higher area of the dielectric film will be coated with the flexible electrodes, as illustrated in FIG. 10.

A peculiar characteristic of the elastomer dielectric film is the vast increase of the breakdown resistance thereof when a preload is applied. If a preloaded film is used, it is possible to apply more intense electric fields on the actuator, thus involving an increase of the generated Maxwell's pressure and the overall displacement of the device [4]. Multilayer stacks manufactured by means of the proposed technique can be, of course, preloaded by using an external frame or support which keeps the material stretched along one or both the planar directions. It has been shown that flexible rubber electrodes made of polyurethane elastomer loaded with carbon black keep a sufficient conductivity (a few hundred KOhm) also when the dielectric elastomeric substrate is biaxially stretched. For this reason, the manufactured multilayer stacks can be stretched and assembled on the desired support after the deposition process of the flexible electrodes. Finally, it shall be noted that the force generated by this type of actuators is proportional to the cross-sectional area thereof. A multilayer geometry consisting in a hundred stacked thin elastomeric layers reduces the actuation voltage, while keeping an actuation force comparable to that of a monolayer actuator with the same overall thickness.

EXAMPLES

In order to manufacture actuator prototypes, masks with a 2×2 cm opening have been used. The flexible electrodes have been manufactured by spraying a mixture of a two-component silicone/polyurethane commercial rubber and carbon black predispersed in toluene. The choice of the electrode formulation has been studied as a function of the dielectric substrate, so as to improve adhesion between the electrodes and the elastomeric dielectric. Particularly, silicone electrodes have been used on a silicone elastomeric dielectric, while polyurethane was preferred for an acrylic elastomeric dielectric. The 3M VHB tape is an acrylic elastomer commonly used for producing DEAs, thanks to the good electrical properties thereof [4]. In order to manufacture acrylic elastomer actuators, VHB tapes with different thickness were used (starting from 0.5 mm for VHB4905, to 50 µm for VHB9460). It shall be apparent that the manufacturing time for the multilayer DEA depends on the film thickness. For example, a 1 cm thick actuator will require 20 layers of VHB4905 and about 200 layers of VHB9460.

Preliminary experiments are currently being undertaken to assess the performance of the multilayer actuators manufactured by the method according to the invention. To assess the actuator deformation as a function of the applied voltage, an experimental setup was used, consisting in a high resolution video camera (Hamamatsu C4742) connected to a Labview software, which generates the suitable electric stimulus and performs an optical measurement.

Figure 11:
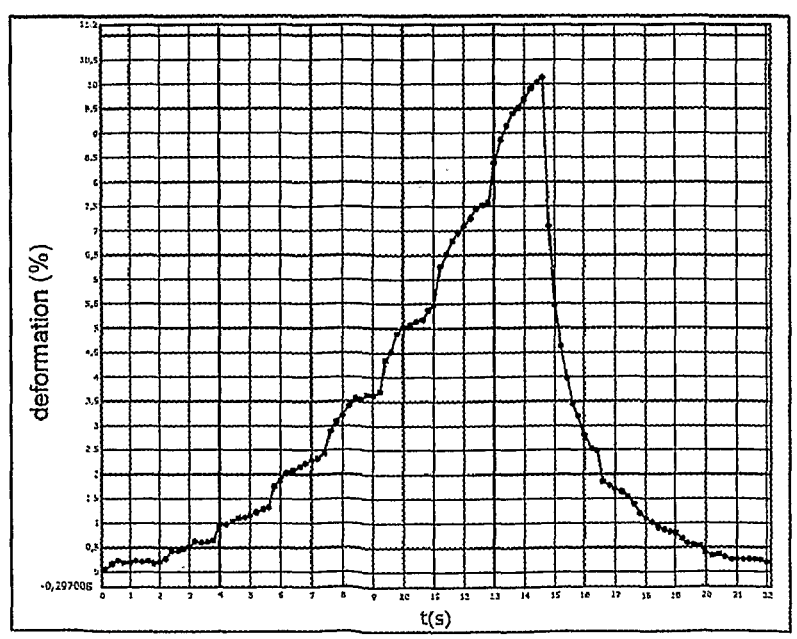
FIG. 11 is a graph representing the lateral deformation as a function of time, for a DEA subjected to voltage increases with increasing intensity.

The preliminary tests conducted on prototypal preloaded actuators made of VHB tape showed great differences in the side deformation produced, 5% to 12%, according to the actuation configuration (contraction/expansion) and the dielectric material used (VHB4905/VHB9460). The experiments further showed a significant viscous effect depending on the viscoelastic properties of the acrylic dielectric and the polymeric matrix used to manufacture the flexible electrodes (FIG. 11).

REFERENCES

[1] Bar-Cohen Y., "Electroactive polymers (EAP) actuators as artificial muscles—reality, potential and challenges", 17, SPIE press, Washington 2004

[2] Bar-Cohen Y., "Electroactive polymers (EAP) as an enabling tool in biomimetics", EAPAD 2007, Vol. 6524, pp. 652403-1-652401-6, 2007

[3] Pelrine R. AND., Kornbluh R. D. and Joseph J. P., "Electrostriction of polymer dielectrics with compliant electrodes as a means of actuation", Sensors and Actuators A-Phys., vol 64, pp 77-85, 1998

[4] Pelrine R., Kornbluh R., Peri Q. and Josph J., "High-speed electrically actuated elastomers with strain greater than 100%", Science, vol 287, pp. 836-839, 2000

[5] Jung K. M., Lee J. H., Cho M. S., Koo J. C., Nam J. D., Lee Y. K., Choi H. R, "Development of enhanced synthetic rubber for the energy efficient polymer actuators", EAPAD 2006, vol 6168, pp N1-N9

[6] Yuan W., Lam T., Biggs J., Hu L, Yu Z., Ha S., Xi D., Senesky M. K., Gruner G., Pei Q., "New electrode Materials for Dielectric Elastomer Actuators", EAPAD 2007, Vol. 6524, pp. 65240N-1-65240N-12, 2007

[7] Ha S. M., Wissler M. Pelrine R. Stanford S., Kovacs G. Pei Q., "Characterization of electroelastomers based on interpenetrating polymer networks", EAPAD 2007, Vol. 6524, pp. 652408-1-652408-10, 2007

[8] Carpi, F. and De Rossi D., "Helical dielectric elastomer actuators", Smart Materials and Structures, vol. 14, pp. 1210-1216, 2005.

[9] Carpi F. and De Rossi D., "Contractile folded dielectric elastomer actuators", EAPAD 2007, Vol. 6524, pp. 65240D-1-65240D-13, 2007

[10] Schlaak H, Jungmann M. Matysek M., Lotz P., "Novel Multilayer Electrostatic Solid-State Actuators with elastic dielectric", EAPAD 2005, vol. 5759, pp. 121-133, 2005

[11] Chuc N. H., Park J., Thuy D. V., Kim H. S., Koo J., Lee Y., Nam J. and Choi H. K. "Linear Artificial Muscle Actuator Based on Synthetic Elastomer", EAPAD 2007, Vol. 6524, pp. 65240J-1-65240D-8, 2007

[12] Kofod G., Kombluh R., Pelrine R. and Sommer-Larsen "Actuation response of polyacrylate dielectric elastomers" EAPAD 2001, vol. 4329, pp 141-147, 2001

[13] Plante, J. S., "Dielectric Elastomer Actuators for Binary Robotics and Mechatronics", Ph.D. thesis, Dept. Mech. Eng., Massachusetts Institute of Technology, Cambridge, BUT, 2006

[14] Plante, J. S., Devita, L., and Dubowsky, S. "A Road to Practical Dielectric Elastomer Actuators Based Robotics and Mechatronics: Discrete Actuation", EAPAD 2007, Vol. 6524, pp. 652406-1-652406-11, 2007

[15] Pei Q., Pelrine R., Stanford S., Kombluh R, Rosenthal M., "Multifunctional Electroelastomer rolls and their application for biomimetic walking robots", EAPAD 2003, Vol. 5051, pp 281-290, 2003

[16] Pei Q., Rosenthal M., Stanford S., Prahlad H., Pelrine R., "Multiple-degrees-of-freedom electroelastomer roll actuators", Smart Material Structures, Vol 13, pp. N86-N92, 2004

The invention claimed is:

1. A method for manufacturing a multilayer polymeric actuator, comprising:

arranging a winding core rotating around a central axis thereof;

winding a dielectric film of polymeric material around the winding core;

during winding, applying a conductive material on a dielectric film exposed face being wound around the winding core, wherein said applying occurs intermittently according to a set sequence, and according to a first and a second geometrical application pattern mutually alternated at each winding turn, so as to form a roll comprising at least one circumferentially localized zone formed by dielectric film layers radially alternated with conductive material layers;

radially cutting the roll at the ends of said circumferentially localized zone, so as to be able to take out a corresponding stack formed by the dielectric film layers alternated to the conductive material layers; and connecting in an electrically conductive manner the conductive material layers having the first geometrical application pattern one to the other and, separately from these, the conductive material layers having the second geometrical application pattern one to the other.

2. The method according to claim 1, wherein said application of the conductive material on the dielectric film exposed face occurs by spraying, and said first and second geometrical application patterns are obtained through a first and a second masks, respectively, which are interchangeable.

3. The method according to claim 1, wherein said electrical connection between the conductive material layers having the first geometrical application pattern and the conductive material layers having the second geometrical application pattern occurs by spraying the conductive material on opposite sides of said stack.

4. The method according to claim 1, wherein a plurality of said circumferentially localized zones is implemented, from which a plurality of corresponding stacks is obtained, said stacks being subsequently assembled one to the other so as to obtain said multilayer polymeric actuator.

* * * * *